United States Patent
Lee

(10) Patent No.: US 9,154,674 B2
(45) Date of Patent: Oct. 6, 2015

(54) CAMERA MODULE

(71) Applicant: SAMSUNG ELECTRO-MECHANICS CO., LTD., Suwon (KR)

(72) Inventor: Mi Ji Lee, Suwon (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 16 days.

(21) Appl. No.: 14/030,986

(22) Filed: Sep. 18, 2013

(65) Prior Publication Data

US 2015/0015778 A1 Jan. 15, 2015

(30) Foreign Application Priority Data

Jul. 12, 2013 (KR) .................. 10-2013-0081987

(51) Int. Cl.
*H04N 5/225* (2006.01)

(52) U.S. Cl.
CPC .... *H04N 5/2252* (2013.01); *H01L 2224/48091* (2013.01); *H01L 2224/48227* (2013.01); *H04N 5/2254* (2013.01)

(58) Field of Classification Search
None
See application file for complete search history.

(56) References Cited

U.S. PATENT DOCUMENTS

| | | | | |
|---|---|---|---|---|
| 2003/0112364 A1* | 6/2003 | Tanida et al. | | 348/375 |
| 2005/0048829 A1* | 3/2005 | Nishio et al. | | 439/331 |
| 2008/0143871 A1* | 6/2008 | Go | | 348/374 |
| 2009/0079863 A1* | 3/2009 | Aoki et al. | | 348/374 |
| 2011/0080515 A1* | 4/2011 | Kang | | 348/374 |
| 2011/0096224 A1* | 4/2011 | Lee | | 348/374 |
| 2011/0134306 A1* | 6/2011 | Kim et al. | | 348/342 |
| 2011/0134307 A1* | 6/2011 | Lee et al. | | 348/342 |
| 2012/0025678 A1* | 2/2012 | Morishima et al. | | 312/111 |
| 2012/0039060 A1* | 2/2012 | Kim | | 361/816 |
| 2013/0120861 A1* | 5/2013 | Park et al. | | 359/824 |
| 2014/0160324 A1* | 6/2014 | Kim | | 348/250 |
| 2014/0253794 A1* | 9/2014 | Miyazaki et al. | | 348/373 |
| 2014/0307162 A1* | 10/2014 | Li et al. | | 348/373 |
| 2014/0313403 A1* | 10/2014 | Chen | | 348/373 |
| 2014/0339668 A1* | 11/2014 | Arima et al. | | 257/443 |
| 2014/0368723 A1* | 12/2014 | Jung et al. | | 348/340 |
| 2015/0009401 A1* | 1/2015 | Lee et al. | | 348/374 |
| 2015/0015770 A1* | 1/2015 | Baik et al. | | 348/345 |
| 2015/0021730 A1* | 1/2015 | Chen | | 257/432 |
| 2015/0037025 A1* | 2/2015 | Kim et al. | | 396/535 |
| 2015/0062421 A1* | 3/2015 | Kwon et al. | | 348/374 |

FOREIGN PATENT DOCUMENTS

JP 2012-47816 A 3/2012
KR 10-2009-0046293 A 5/2009

* cited by examiner

*Primary Examiner* — Michael Osinski
(74) *Attorney, Agent, or Firm* — NSIP Law

(57) ABSTRACT

There is provided a camera module including: a lens barrel including at least one lens disposed on an optical axis; a housing having the lens barrel disposed therein; a circuit board disposed below the housing; and a shield-can coupled to the housing and enclosing an outer surface of the housing, wherein the circuit board is provided with a ground pad, and a contact surface of the shield-can contacting the ground pad is formed to have a convex-concave shape.

10 Claims, 5 Drawing Sheets

CAMERA MODULE

CROSS-REFERENCE TO RELATED APPLICATIONS

This application claims the benefit of Korean Patent Application No. 10-2013-0081987 filed on Jul. 12, 2013, with the Korean Intellectual Property Office, the disclosure of which is incorporated in its entirety herein by reference.

BACKGROUND OF THE INVENTION

1. Field of the Invention

The present invention relates to a camera module.

2. Description of the Related Art

Generally, portable communication terminals such as mobile phones, personal digital assistants (PDAs), portable personal computers (PCs), and the like, have had the ability to transmit image data, in addition to text or voice data.

In order to transmit image data or conduct video calls according to this trend, a portable communication terminal has been standardly equipped with a camera module.

Generally, the above-mentioned camera module generates electromagnetic waves while being driven, and when such electromagnetic waves are discharged externally, other electronic components may be negatively influenced, to thereby cause communications problems or malfunctions.

Therefore, in order to block electromagnetic interference (EMI) as described above, a shield-can formed of a metal is commonly used, wherein the shield-can covers each of, or a group of, electronic components to serve to block the electromagnetic interference negatively influencing these electronic components and to protect these electronic components from external impacts.

Here, the shield-can may be electrically connected to a ground pad on a circuit board, and the electrical connection between the shield-can and the ground pad is performed by a conductive bond.

However, when using the conductive bond, electrical resistance for shielding electromagnetic waves may be increased, whereby efficiency in shielding electromagnetic waves may be decreased.

SUMMARY OF THE INVENTION

An aspect of the present invention provides a camera module having increased efficiency in shielding electromagnetic waves and decreasing electrical resistance.

According to an aspect of the present invention, there is provided a camera module, including: a lens barrel including at least one lens disposed on an optical axis; a housing having the lens barrel disposed therein; a circuit board disposed below the housing; and a shield-can coupled to the housing and enclosing an outer surface of the housing, wherein the circuit board is provided with a ground pad, and a contact surface of the shield-can contacting the ground pad is formed to have a convex-concave shape.

The shield-can may be coupled to the housing while a convex portion of the contact surface of the shield-can presses the ground pad.

The ground pad and the contact surface of the shield-can may have a conductive bond provided therebetween.

A convex portion of the contact surface of the shield-can may penetrate through the conductive bond and directly contact the ground pad.

A convex portion of the contact surface of the shield-can may contact the ground pad, and a concave portion of the contact surface of the shield-can may contact the conductive bond.

The contact surface of the shield-can may contact both the conductive bond and the ground pad.

A convex portion of the contact surface of the shield-can may have a pointed end.

The circuit board may be disposed below the housing so as to be protruded outwardly of the housing, and the ground pad may be disposed on a portion of the circuit board protruded outwardly of the housing.

An inner surface of the shield-can may enclose the outer surface of the housing, and a lower surface of the shield-can may contact the ground pad.

According to another aspect of the present invention, there is provided a camera module, including: a lens barrel including at least one lens disposed on an optical axis; a housing having the lens barrel disposed therein; a circuit board disposed below the housing; and a shield-can coupled to the housing and enclosing an outer surface of the housing, wherein the circuit board is provided with a ground pad, and a contact surface of the shield-can contacting the ground pad is provided with a protrusion protruded to the ground pad.

The protrusion may include a plurality of the protrusions spaced apart from each other by a predetermined interval.

The ground pad and the contact surface of the shield-can may have a conductive bond provided therebetween.

The protrusion may contact the ground pad, and a remaining portion of the contact surface of the shield-can except for the protrusion may contact the conductive bond.

The protrusion may have a rounded end.

The protrusion may have a triangular prism shape having a pointed end.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
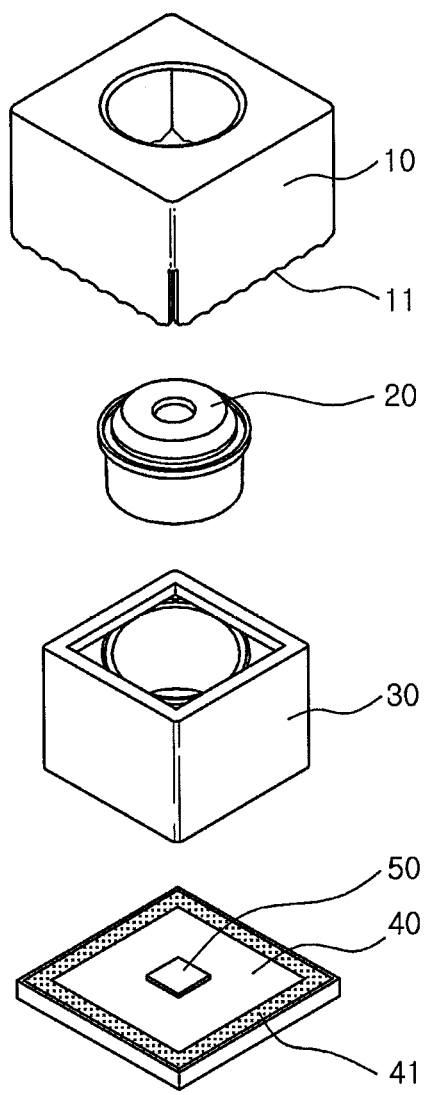
FIG. 1 is an exploded perspective view of a camera module according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 2:
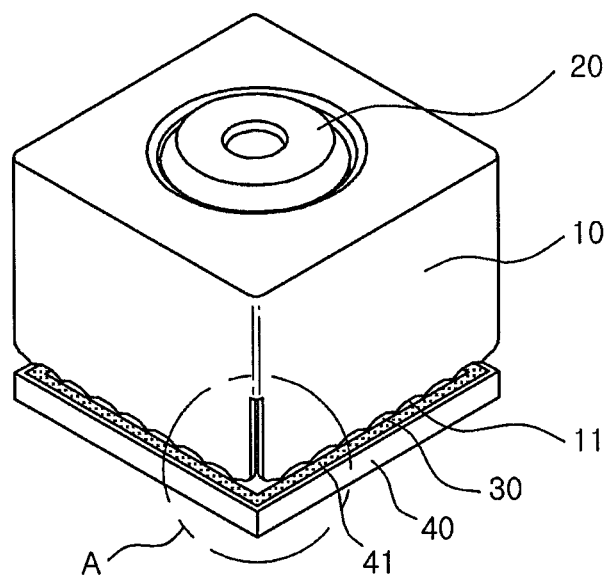
FIG. 2 is a perspective view of the camera module according to the embodiment of the present invention.

FIG. 1 is an exploded perspective view of a camera module according to an embodiment of the present invention, and FIG. 2 is a perspective view of the camera module according to the embodiment of the present invention.

Referring to FIGS. 1 and 2, the camera module according to the embodiment of the present invention may include a lens barrel 20, a housing 30, a shield-can 10, an image sensor 50, and a printed circuit board 40.

Terms with respect to directions will be first defined. An optical axis direction refers to a vertical direction based on the lens barrel 20 and a horizontal direction refers to a direction perpendicular to the optical axis direction.

The lens barrel 20 may have a hollow cylindrical shape so that at least one lens for imaging an object may be received therein, and the lens may be provided in the lens barrel 20 on an optical axis.

The lens barrel 20 may be coupled to the housing 30, and specifically, the lens barrel 20 may be disposed in the housing 30.

Here, the lens barrel 20 may be moved in the optical axis direction for auto-focusing.

In order to move the lens barrel 20 in the optical axis direction, an actuator (not shown) including a voice coil motor may be provided in the housing 30.

The actuator (not shown) may include a coil, a magnet, and a yoke, and the coil may move the lens barrel in the optical axis direction by gravitation and repulsion with the magnet adjacent thereto.

The magnet may form a magnetic field having a predetermined magnitude. When power is applied to the coil, driving force may be generated by electromagnetic force between the magnet and the coil, and the lens barrel may be moved in the optical direction by the driving force.

However, a unit for moving the lens barrel is not limited to the actuator including the voice coil motor (VCM), and various driving schemes, such as a mechanical driving scheme, a piezoelectric driving scheme using a piezoelectric element, or the like, may be used.

By moving the lens barrel 20 by the above-described operation, an auto-focusing or zooming function may be performed.

Meanwhile, a position sensor may be provided at a center of the coil.

The position sensor senses a current position of the lens barrel 20 and provides the sensed current position to a controlling unit (not shown), and the controlling unit (not shown) may control the movement of the lens barrel 20 using current position information of the lens barrel 20 received from the position sensor and destination position information.

Because the position sensor is disposed at the center of the coil, a separate space for mounting the position sensor in the housing 30 may not be required. Therefore, the actuator (not shown) may be miniaturized and manufacturing tolerances in a manufacturing process may be decreased.

The shield-can 10 may be coupled to the housing 30 and enclose an outer surface of the housing 30 and the shield-can 10 may serve to shield electromagnetic waves generated during driving of the camera module.

That is, the camera module generates electromagnetic waves during the driving thereof, and when electromagnetic waves are discharged to the outside, it may influence other electronic components to thereby cause communication problems or malfunctions.

Therefore, in order to prevent electromagnetic waves from being discharged to the outside, the shield-can 10 may be coupled to the housing 30.

In this case, the shield-can 10 may be grounded to a ground pad 41 provided on the printed circuit board 40, such that electromagnetic waves may be shielded.

Meanwhile, the shield-can 10 may have a through-hole (not shown) formed therein so that external light may be incident through the lens barrel 20, and the external light incident through the through-hole may be received by the image sensor 50 through the lens.

The image sensor 50 such as a CCD or a CMOS may be mounted on the printed circuit board 40 by wire bonding and the printed circuit board 40 may be mounted below the housing 30.

An image of the object may be concentrated on the image sensor 50 and be stored in a memory of a device as data, and the stored data may be displayed as the image through a display medium in the device.

Here, an infrared (IR) filter (not shown) may be disposed between the lens barrel 20 and the image sensor 50.

That is, the IR filter may be disposed below the lens barrel 20.

The light passing through the lens may pass through the IR filter so that infrared light is blocked. Therefore, an introduction of the infrared light into the image sensor 50 may be prevented.

The IR filter may be formed of a glass material and may be manufactured by depositing several materials having different refractive indices on a surface thereof in order to block light in an infrared region.

Figure 3:
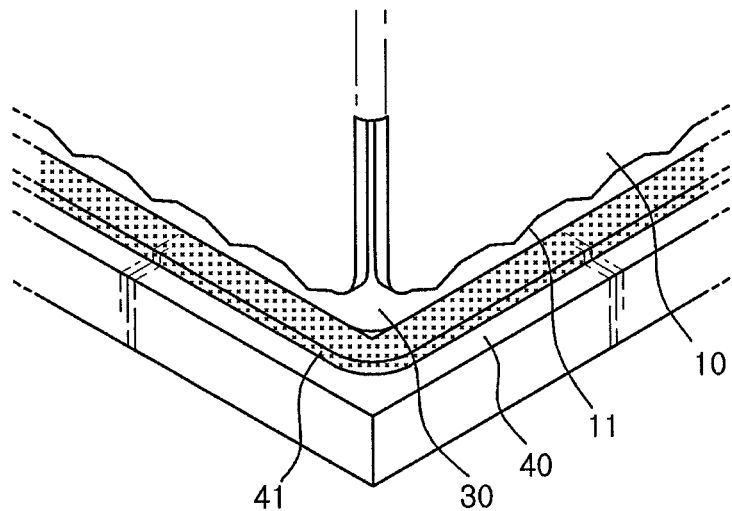
FIG. 3 is an enlarged perspective view of portion A of FIG. 2.
Figure 4:
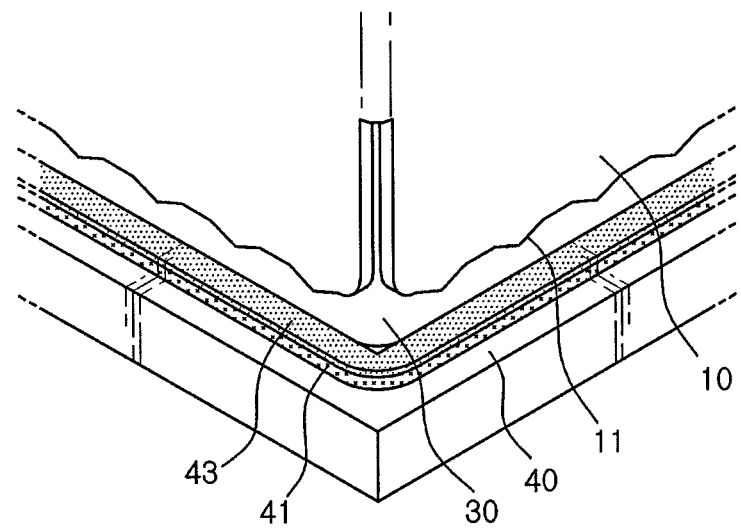
FIG. 4 is a partially enlarged perspective view of the camera module according to the embodiment of the present invention in which a conductive bond is provided on a ground pad.

FIG. 3 is an enlarged perspective view of portion A of FIG. 2, and FIG. 4 is a partially enlarged perspective view of the camera module according to the embodiment of the present invention in which a conductive bond is provided on the ground pad.

Figure 5A:
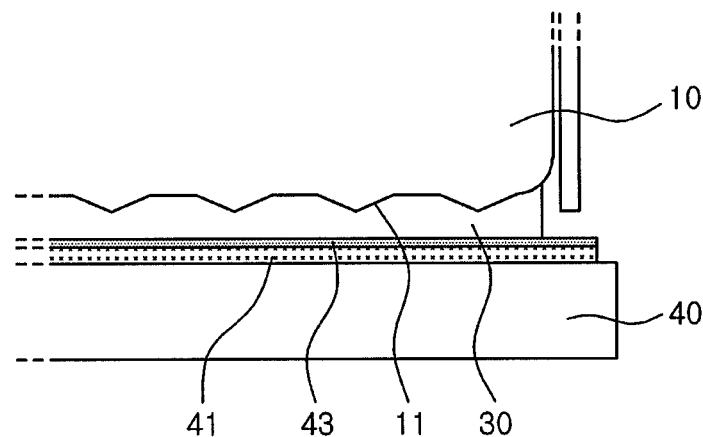
FIG. 5A is a side view of the camera module according to the embodiment of the present invention before a shield-can contacts the ground pad.
Figure 5B:
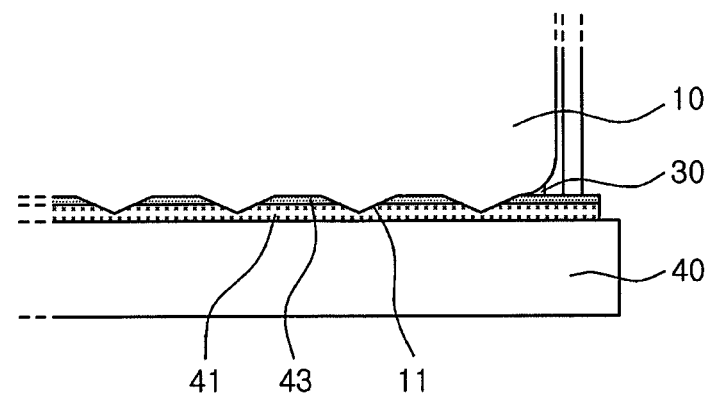
FIG. 5B is a side view of the camera module according to the embodiment of the present invention in which the shield-can contacts the ground pad.

In addition, FIG. 5A is a side view of the camera module according to the embodiment of the present invention before the shield-can contacts the ground pad, and FIG. 5B is a side view of the camera module according to the embodiment of the present invention in which the shield-can contacts the ground pad.

Referring to FIGS. 3 through 5B, the ground pad 41 may be formed on the printed circuit board 40 provided in the camera module according to the embodiment of the present invention.

Specifically, the printed circuit board 40 may be disposed below the housing 30 so as to be protruded outwardly of the housing 30, and the ground pad 41 may be formed on a portion of the printed circuit board 40 protruded outwardly of the housing 30.

Therefore, the shield-can 10 may be coupled to the housing 30, such that an inner surface of the shield-can 10 may enclose the outer surface of the housing 30 and a lower surface of the shield-can 10 may contact the ground pad 41.

Here, the lower surface of the shield-can 10 contacting the ground pad 41 refers to a contact surface 11.

The contact surface 11 of the shield-can 10 may be formed to have a convex-concave shape so that a concave portion and a convex portion are repeatedly formed.

When the shield-can 10 is coupled to the housing 30 and the contact surface 11 of the shield-can 10 contacts the ground pad 41, the convex portions of the contact surface 11 may press the ground pad 41.

Here, as shown in FIG. 4, a conductive bond 43 may be applied between the ground pad 41 and the contact surface 11 of the shield-can 10.

That is, the conductive bond 43 may be positioned between the ground pad 41 and the contact surface 11 of the shield-can 10.

Referring to FIGS. 5A and 5B, during coupling the shield-can 10 to the housing 30, the contact surface 11 presses the conductive bond 43 applied to the ground pad 41. In this case, the convex portions of the contact surface 11 of the shield-can 10 may penetrate through the conductive bond 43 to directly contact the ground pad 41.

In addition, the concave portions of the contact surface 11 of the shield-can 10 may contact the conductive bond 43.

Therefore, the contact surface 11 of the shield-can 10 having the convex-concave shape may contact both the conductive bond 43 and the ground pad 41.

In the case in which the shield-can 10 is electrically connected to the ground pad 41 through the conductive bond 43, electrical resistance for shielding electromagnetic waves is increased, such that efficiency in shielding electromagnetic waves may be decreased.

However, because the camera module according to the embodiment of the present invention may have a portion of the contact surface 11 of the shield-can 10 directly contacting the ground pad 41, electrical resistance for shielding electromagnetic waves may be decreased. As a result, the efficiency in shielding electromagnetic waves may be improved.

Meanwhile, as shown in FIGS. 3 through 4B, the convex portion of the contact surface 11 of the shield-can 10 may have a pointed end, but is not limited thereto. For example, the convex portion may have any shape as long as it may penetrate through the conductive bond 43 and directly contact the ground pad 41.

Figure 6:
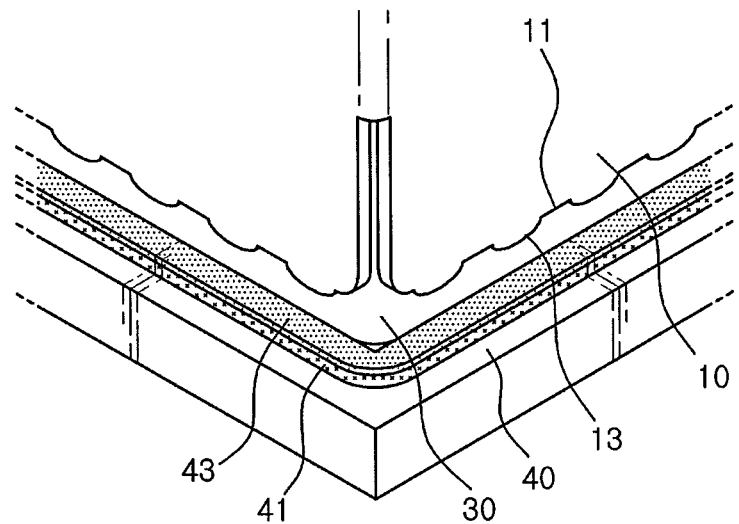
FIGS. 6 and 7 are partially enlarged perspective views of a camera module according to another embodiment of the present invention.
Figure 7:
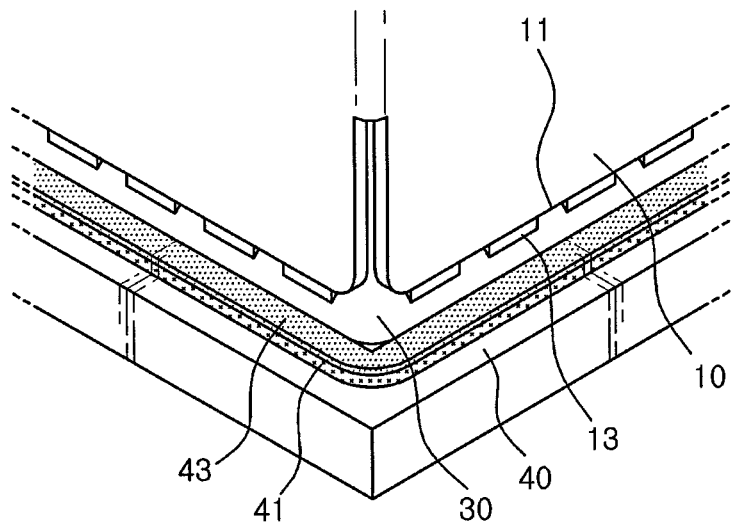

FIGS. 6 and 7 are partially enlarged perspective views of a camera module according to another embodiment of the present invention.

Referring to FIGS. 6 and 7, the camera module according to another embodiment of the present invention has the same configuration as the above-described configuration of the camera module according to the previous embodiment of the present invention, except for a shape of the contact surface 11 of the shield-can 10, and thus a description thereof other than the shape of the contact surface 11 of the shield-can 10 will be omitted.

The shield-can 10 may be coupled to the housing 30 and enclose an outer surface of the housing 30 and the shield-can 10 may serve to shield electromagnetic waves generated during driving of the camera module.

The shield-can 10 may be grounded to the ground pad 41 provided on the printed circuit board 40, such that electromagnetic waves may be shielded.

That is, the shield-can 10 may be coupled to the housing 30, such that an inner surface of the shield-can 10 may enclose the outer surface of the housing 30 and a lower surface of the shield-can 10 may contact the ground pad 41.

Here, the lower surface of the shield-can 10 contacting the ground pad 41 refers to a contact surface 11.

The contact surface 11 of the shield-can 10 may be provided with protrusions 13 protruded to the ground pad 41, and the plurality of protrusions 13 may be provided to be spaced apart from each other by a predetermined interval.

Therefore, when the shield-can 10 is coupled to the housing 30 and the contact surface 11 of the shield-can 10 contacts the ground pad 41, the protrusions 13 may press the ground pad 41.

Here, the conductive bond 43 may be applied between the ground pad 41 and the contact surface 11 of the shield-can 10.

That is, the conductive bond 43 may be positioned between the ground pad 41 and the contact surface 11 of the shield-can 10.

Therefore, during coupling the shield-can 10 to the housing 30, the contact surface 11 presses the conductive bond 43 applied to the ground pad 41. In this case, the protrusions 13 provided on the contact surface 11 of the shield-can 10 may penetrate through the conductive bond 43 to directly contact the ground pad 41.

In addition, a remaining portion of the contact surface 11 of the shield-can 10 except for the protrusions 13 may contact the conductive bond 43.

Therefore, the contact surface 11 of the shield-can 10 may contact both the conductive bond 43 and the ground pad 41.

Here, the protrusion 13 may have a rounded end as shown in FIG. 6, and may have a triangular prism shape having a pointed end as shown in FIG. 7.

However, the shape of the protrusion is not limited thereto, but the protrusion 13 may have any shape as long as it may penetrate through the conductive bond 43 and directly contact the ground pad 41.

As set forth above, according to embodiments of the present invention, efficiency in shielding electromagnetic waves may be increased by reducing electrical resistance.

While the present invention has been shown and described in connection with the embodiments, it will be apparent to those skilled in the art that modifications and variations can be made without departing from the spirit and scope of the invention as defined by the appended claims.

What is claimed is:

1. A camera module, comprising:
   a lens barrel including at least one lens disposed on an optical axis;
   a housing having the lens barrel disposed therein;
   a circuit board disposed below the housing; and
   a shield-can coupled to the housing and enclosing an outer surface of the housing,
   wherein the circuit board is provided with a ground pad, and
   a contact surface of the shield-can contacting the ground pad is formed to have a convex-concave shape,
   wherein the ground pad and the contact surface of the shield-can have a conductive bond provided therebetween, and
   wherein a convex portion of the contact surface of the shield-can contacts the ground pad, and a concave portion of the contact surface of the shield-can contacts the conductive bond.

2. The camera module of claim 1, wherein the shield-can is coupled to the housing while a convex portion of the contact surface of the shield-can presses the ground pad.

3. A camera module, comprising:
   a lens barrel including at least one lens disposed on an optical axis;
   a housing having the lens barrel disposed therein;
   a circuit board disposed below the housing; and
   a shield-can coupled to the housing and enclosing an outer surface of the housing,
   wherein the circuit board is provided with a ground pad, and a contact surface of the shield-can contacting the ground pad is formed to have a convex-concave shape, wherein the ground pad and the contact surface of the shield-can have a conductive bond provided therebetween, and wherein a convex portion of the contact surface of the shield-can penetrates through the conductive bond and directly contacts the ground pad.

4. The camera module of claim 1, wherein a convex portion of the contact surface of the shield-can has a pointed end.

5. The camera module of claim 1, wherein the circuit board is disposed below the housing so as to be protruded outwardly of the housing, and the ground pad is disposed on a portion of the circuit board protruded outwardly of the housing.

6. The camera module of claim 5, wherein an inner surface of the shield-can encloses the outer surface of the housing, and a lower surface of the shield-can contacts the ground pad.

7. A camera module, comprising:

a lens barrel including at least one lens disposed on an optical axis;

a housing having the lens barrel disposed therein;

a circuit board disposed below the housing; and a shield-can coupled to the housing and enclosing an outer surface of the housing, wherein the circuit board is provided with a ground pad, and a contact surface of the shield-can contacting the ground pad is provided with a protrusion protruded to the ground pad, wherein the ground pad and the contact surface of the shield-can have a conductive bond provided therebetween, and wherein the protrusion contacts the ground pad, and a remaining portion of the contact surface of the shield-can except for the protrusion contacts the conductive bond.

8. The camera module of claim 7, wherein the protrusion comprises a plurality of protrusions spaced apart from each other by a predetermined interval.

9. The camera module of claim 7, wherein the protrusion has a rounded end.

10. The camera module of claim 7, wherein the protrusion has a triangular prism shape having a pointed end.

* * * * *